United States Patent
Santurkar et al.

(10) Patent No.: US 7,518,399 B1
(45) Date of Patent: *Apr. 14, 2009

(54) METHOD OF REDUCING LEAKAGE CURRENT USING SLEEP TRANSISTORS IN PROGRAMMABLE LOGIC DEVICE

(75) Inventors: Vikram Santurkar, Fremont, CA (US); Hyun Mo Yi, Mountain View, CA (US); Christopher F. Lane, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/030,083

(22) Filed: Feb. 12, 2008

Related U.S. Application Data

(63) Continuation of application No. 11/318,324, filed on Dec. 23, 2005, now Pat. No. 7,355,440.

(51) Int. Cl.
*H03K 19/173* (2006.01)
*G06F 7/38* (2006.01)
(52) U.S. Cl. ......................... 326/38; 326/41
(58) Field of Classification Search ................ 326/33, 326/39, 40, 41, 44, 45; 327/544; 365/227
See application file for complete search history.

(56) References Cited

U.S. PATENT DOCUMENTS 7,098,689 B1 * 8/2006 Tuan et al. ..................... 326/44
2003/0218478 A1 * 11/2003 Sani et al. ..................... 326/33

* cited by examiner

*Primary Examiner*—Daniel D. Chang
(74) *Attorney, Agent, or Firm*—Martine Penilla & Gencarella, LLP

(57) ABSTRACT

A programmable logic device (PLD) having minimal leakage current for inactive logic blocks is provided. The PLD includes an array of logic blocks. Among the array of logic blocks, one of the array of logic blocks monitors the level of activity of each of the remaining logic blocks. The level of activity may be monitored by observing the input and output pin of the logic blocks. The PLD further includes a plurality of driven wires defining a routing pattern between the array of logic blocks. When one of the array of logic blocks detect inactivity in any one of the remaining logic blocks for a certain duration, the one of the array logic blocks transmits a signal invoking a sleep mode for the inactive logic blocks. A sleep transistor with a threshold voltage level that is capable minimizing the leakage current is associated with each of the remaining block. The gate of the sleep transistor receives the signal transmitted by one of the array logic blocks and the signal switches off the sleep transistor.

20 Claims, 14 Drawing Sheets

METHOD OF REDUCING LEAKAGE CURRENT USING SLEEP TRANSISTORS IN PROGRAMMABLE LOGIC DEVICE

CROSS-REFERENCE TO RELATED APPLICATION

This is a continuation application based on U.S. patent application Ser. No. 11/318,324 filed Dec. 23, 2005 now U.S. Pat. No. 7,355,440, which is incorporated herein by reference in its entirety for all purposes.

BACKGROUND

Description of the Related Art

As the demand for smaller and faster devices increases, the manufacturers of integrated circuits (IC) are continuing to strive to decrease the feature sizes while increasing the speed, logic and memory densities. Currently, the IC technology is being scaled to sub-micron levels where the device feature sizes are reaching 65 nanometer and below in geometries. The IC device dimensions have reached a critical juncture where static leakage current or power consumption is becoming a significant portion of the overall device power.

Even though static leakage power consumption is a major stumbling block for the whole semiconductor industry, this is especially important for the manufacturers of programmable logic devices (PLDs) as the PLDs provide storage, logic and wires in a standard package that can be programmed by the user according to the specifications of the user. Consequently, a large number of resources available on the PLDs may remain unused and stay in static mode. Thus, the resources that stay in static mode cause the static power consumption to increase.

Accordingly, there exists a need for a method to decrease the static power consumption of integrated circuits as feature sizes continue to shrink, especially with regard to PLDs.

SUMMARY

Broadly speaking, the present invention fills these needs by providing a method and system for reducing leakage current using sleep transistors. The embodiments described herein provide sleep transistors for each element of the PLD so that every element in the PLD may be put into sleep mode. Moreover, the embodiments provide techniques to prevent output nodes of regions in sleep mode from floating, through the use of pull-up and pull-down transistors. It should be appreciated that the present invention can be implemented in numerous ways, including as a method, a system, or an apparatus. Several inventive embodiments of the present invention are described below.

In one aspect of the invention, a programmable logic device (PLD) having minimal leakage current for inactive logic blocks is provided. The PLD includes an array of logic blocks. Among the array of logic blocks, one of the array of logic blocks monitors the level of activity of each of the remaining logic blocks. The level of activity may be monitored by observing the input and output pin of the logic blocks. The PLD further includes a plurality of driven wires defining a routing pattern between the array of logic blocks. When one of the array of logic blocks detects inactivity in any one of the remaining logic blocks for a certain duration, a signal invoking a sleep mode for the inactive logic blocks is transmitted by the logic within the logic block detecting the inactivity. A sleep transistor with a threshold voltage level that is capable minimizing the leakage current is associated with each of the remaining blocks. The gate of the sleep transistor receives the signal transmitted by one of the array logic blocks and the signal switches off the sleep transistor.

The PLD may be designed such that sleep transistors are associated with each logic element within the logic blocks in one to one correspondence. In this embodiment, a global sleep signal is distributed throughout the logic blocks and the logic elements within the logic blocks. In conjunction with a logic gate, and a CRAM bit, portions of the logic elements may be placed into sleep mode to further reduce the leakage current.

In another aspect of the invention, a method for reducing leakage current in a PLD is provided. The method includes applying a global sleep signal to the logical array blocks of the PLD. Then, a determination is made as to whether a component, e.g., a logic block or a logic element, of the PLD is in an inactive mode. If it is determined that a component of the PLD is in an inactive mode, then the global sleep signal is applied locally to the component of the PLD that is inactive to minimize the leakage current associated with the component. If the component is determined to be active, then the global signal is prevented from inactivating the component. In one embodiment, a logic gate is used to gate off the global sleep signal with a configuration random access memory (CRAM) bit to achieve the granularity to apply the sleep signal to individual logic elements of the PLD.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

A method and system for reducing leakage current using sleep transistors is provided. The embodiments described herein provide sleep transistors for each element of the PLD so that every element in the PLD may be put into sleep mode. Alternatively, blocks of logic may be inactivated as described below. Moreover, the embodiments provide techniques to prevent nodes from floating, when the nodes are in electrical communication with external active regions within the PLDs.

Figure 1:
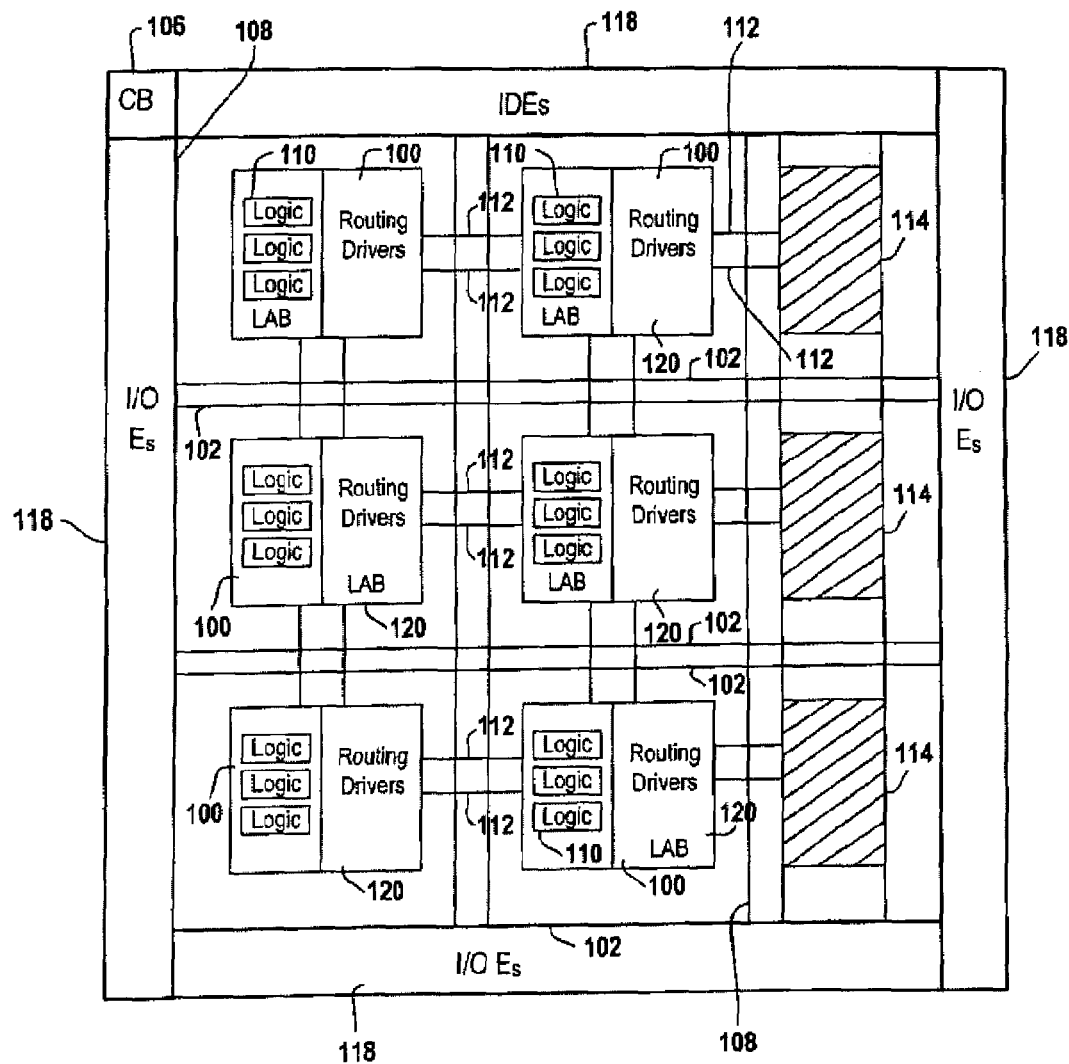
FIG. 1 is a simplified schematic diagram of the layout of a programmable logic device (PLD), in accordance with an embodiment of the invention.

FIG. 1 is a simplified schematic diagram of the layout of a programmable logic device (PLD), in accordance with an embodiment of the invention. In one embodiment, the PLD is a Field Programmable Gate Array (FPGA). One skilled in the art will understand and appreciate that other types of PLDs may be used in place of FPGAs. The layout includes input/output circuitry blocks (IOEs) 118, logical array blocks 100, horizontal interconnects 102, vertical interconnects 108, control blocks 106, and memory blocks 114. Logical array blocks (LABs) 100 are grouped logical resources configured or programmed to perform logical functions desired by the user. LABs 100 include a varying number of logic elements 110. Although shown as single lines in FIG. 1, each of horizontal and vertical interconnects 102 and 108, respectively, may represent a plurality of signal conductors. LABs 100 may have inputs and outputs (not shown), which may or may not be programmably connected to horizontal and vertical interconnects 102 and 108, respectively. Control block 106 programs the PLD. LABs 100 are shown to include routing drivers 120. Routing drivers 120 may route the signals within the LABs 100 or external to the corresponding LABs to other regions within the PLD.

It should be appreciated that the functional blocks included in the PLD of FIG. 1 are exemplary and the PLD may include numerous other known functional blocks which are not included in FIG. 1, e.g., a digital signal processing block. As described above, depending on the utility of the user, one or more of the functional blocks within the PLD may not be used by the user. As such, the embodiments described below will provide a way to minimize power consumption based on use or certain logic blocks being inactive. As used herein, a functional block may be referred to as a component of the PLD.

Figure 2:
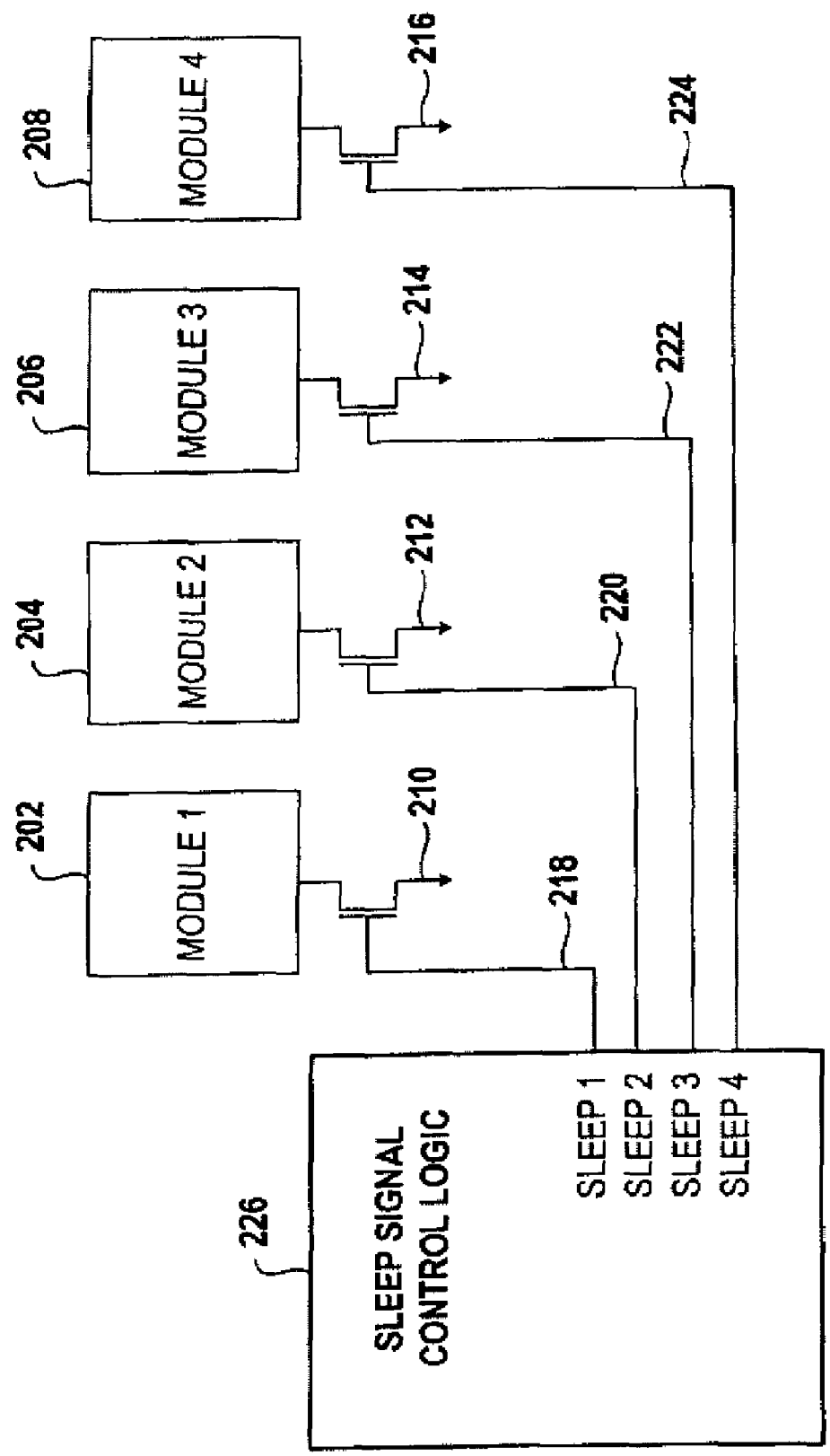
FIG. 2 is a high-level diagram illustrating the use of sleep logic in integrated circuits, in accordance with an embodiment of the present invention.

FIG. 2 is a high-level diagram illustrating the use of sleep logic in integrated circuits, in accordance with an embodiment of the present invention. FIG. 2 includes modules 202, 204, 206, and 208, sleep transistors 210, 212, 214 and 216, and sleep control logic 226. Sleep control logic 226 is in communication with sleep transistors 210, 212, 214, and 216. Sleep signals 218, 220, 222, and 224 are used to switch off sleep transistors 210, 212, 214, and 216, respectively. By controlling each of the sleep transistors 210, 212, 214, and 216, the individual modules 202, 204, 206, and 208 may be isolated to reduce static leakage. For example, if sleep control logic 226 generates sleep signal 218 and applies the sleep signal to the gate of sleep transistor 210, then the sleep transistor 210 will be switched off. This in turn will put module 202 into sleep mode.

Figure 3:
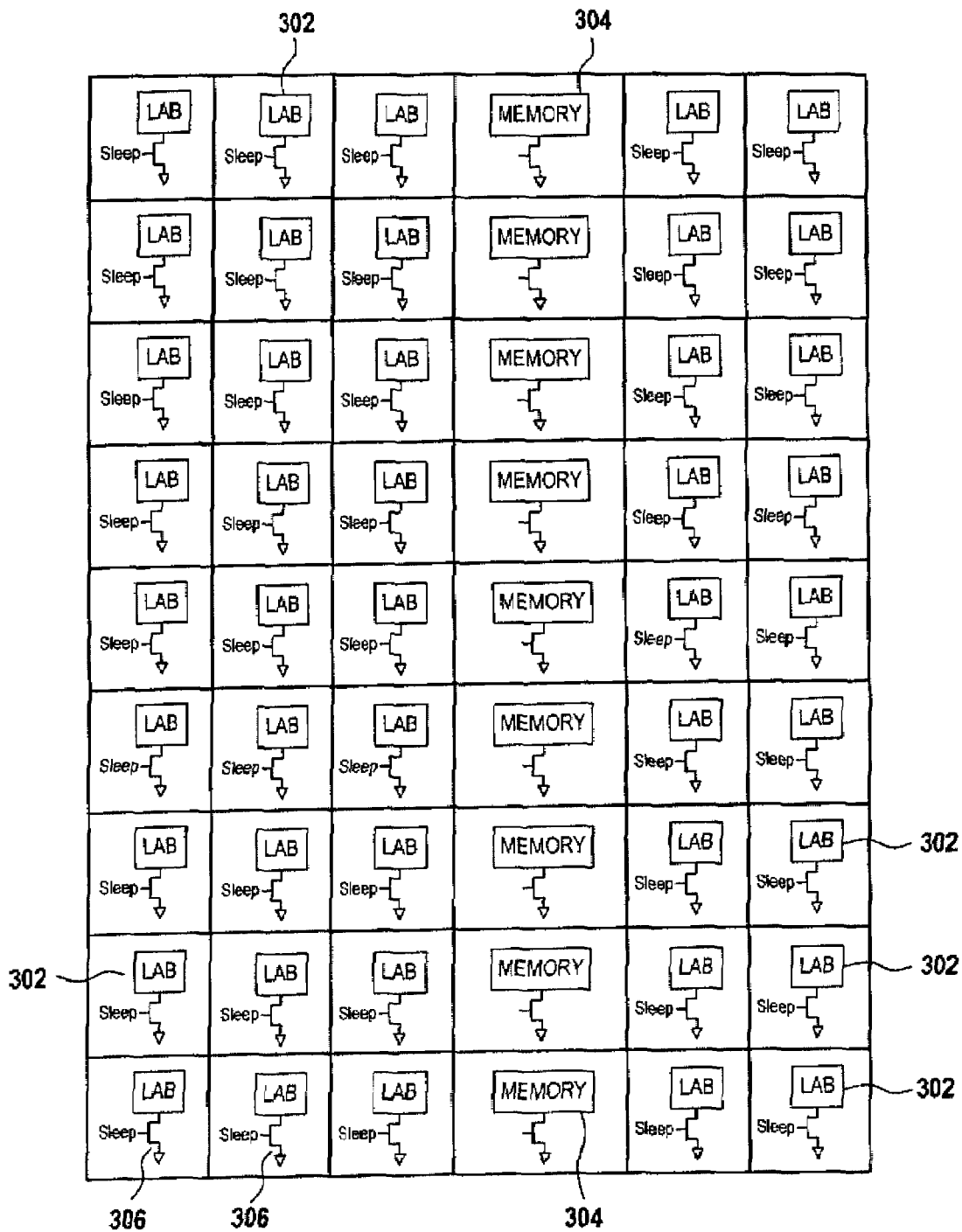
FIG. 3 shows an exemplary floor plan of a programmable logic device (PLD), in accordance with an embodiment of the present invention.

FIG. 3 shows an exemplary floor plan of a programmable logic device (PLD), in accordance with an embodiment of the present invention. FIG. 3 includes logical array blocks (LABs) 302, and memory blocks 304. Each of the LABs 302 and each of the memory blocks 304 are connected to sleep transistor 306. One skilled in the art should understand that even though a PLD in FIG. 3 is shown to include LABs and memory blocks, other types of functional blocks such as digital signal processing (DSP) blocks may also be included in FIG. 3. As illustrated in FIG. 3, by applying a sleep signal to the sleep transistor 306 causes corresponding LAB 302 or memory block 304 to be put into sleep mode.

Figure 4:
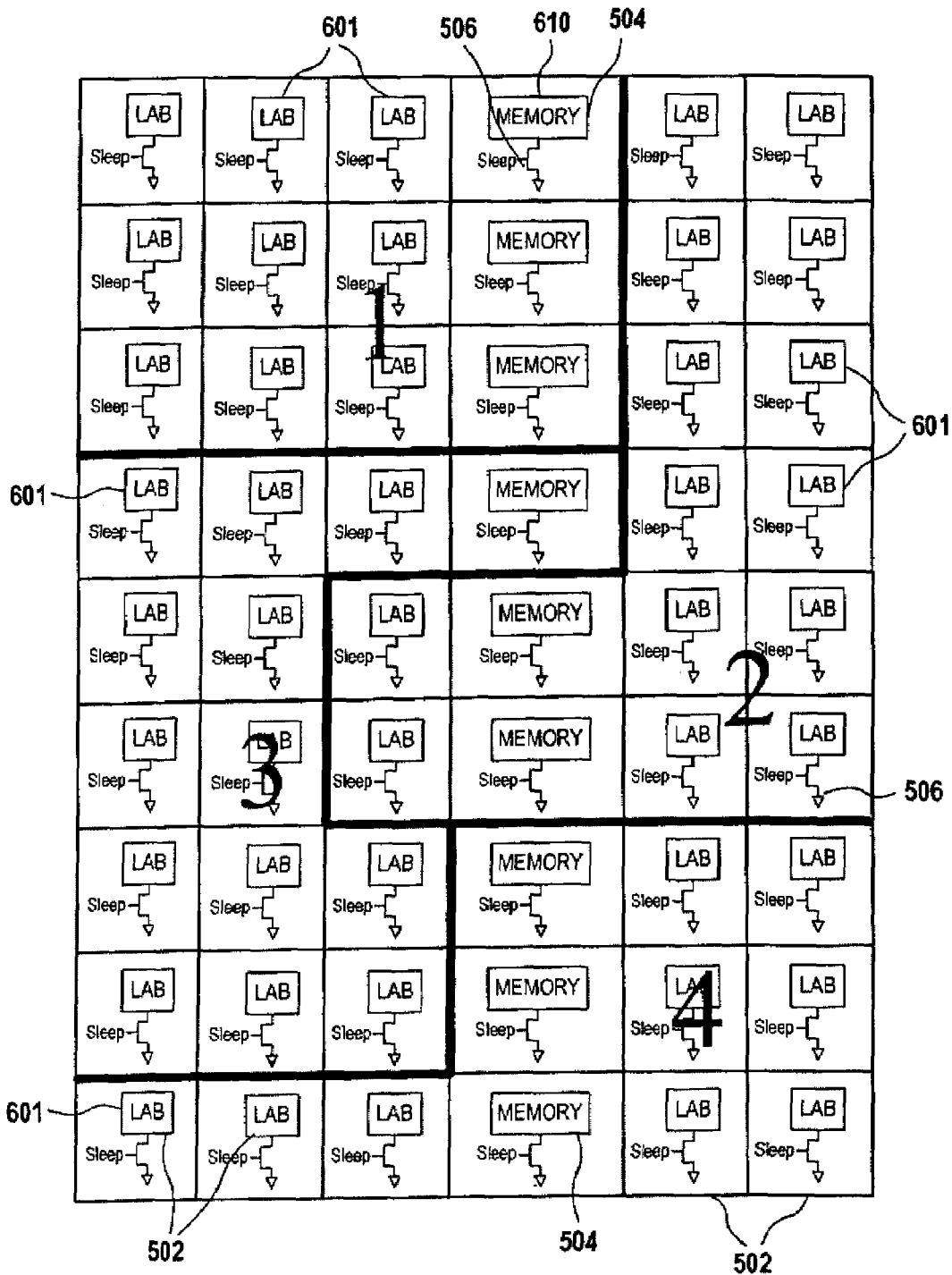
FIG. 4 shows logic modules mapped into PLD, in accordance with an embodiment of the present invention.

FIG. 4 shows a PLD, mapped with four different regions 1, 2, 3, and 4, in accordance with an embodiment of the present invention. Each of the regions 1, 2, 3, and 4 may represent one or more logic functions. Also, regions 1, 2, 3, and 4 may be interconnected to define desired logic functions. One skilled in art should understand that the number of LABs and memory blocks in each of the regions 1, 2, 3, and 4 and the routing wires connecting this logic may be any suitable configuration. Although illustrated as one unit, the LABs and memory blocks within each region may occupy different areas of the PLD.

As the PLDs can be programmed by the user, the regions may be mapped into PLD in many different ways. An exemplary placement of regions 1, 2, 3, and 4 on the PLD are shown in FIG. 4. As can be seen, sleep transistors 506 are distributed among the different regions throughout the PLD and are connected to each and every LAB 502 and memory element 504. Thus, by shutting off sleep transistors 506 within a particular region, the entire region can be put into sleep mode when inactive. One skilled in the art should understand that a subset of LABs 502 and memory elements 504, within a region, may be shut off by selectively switching off the corresponding sleep transistor 506 attached to those elements.

Figure 5:
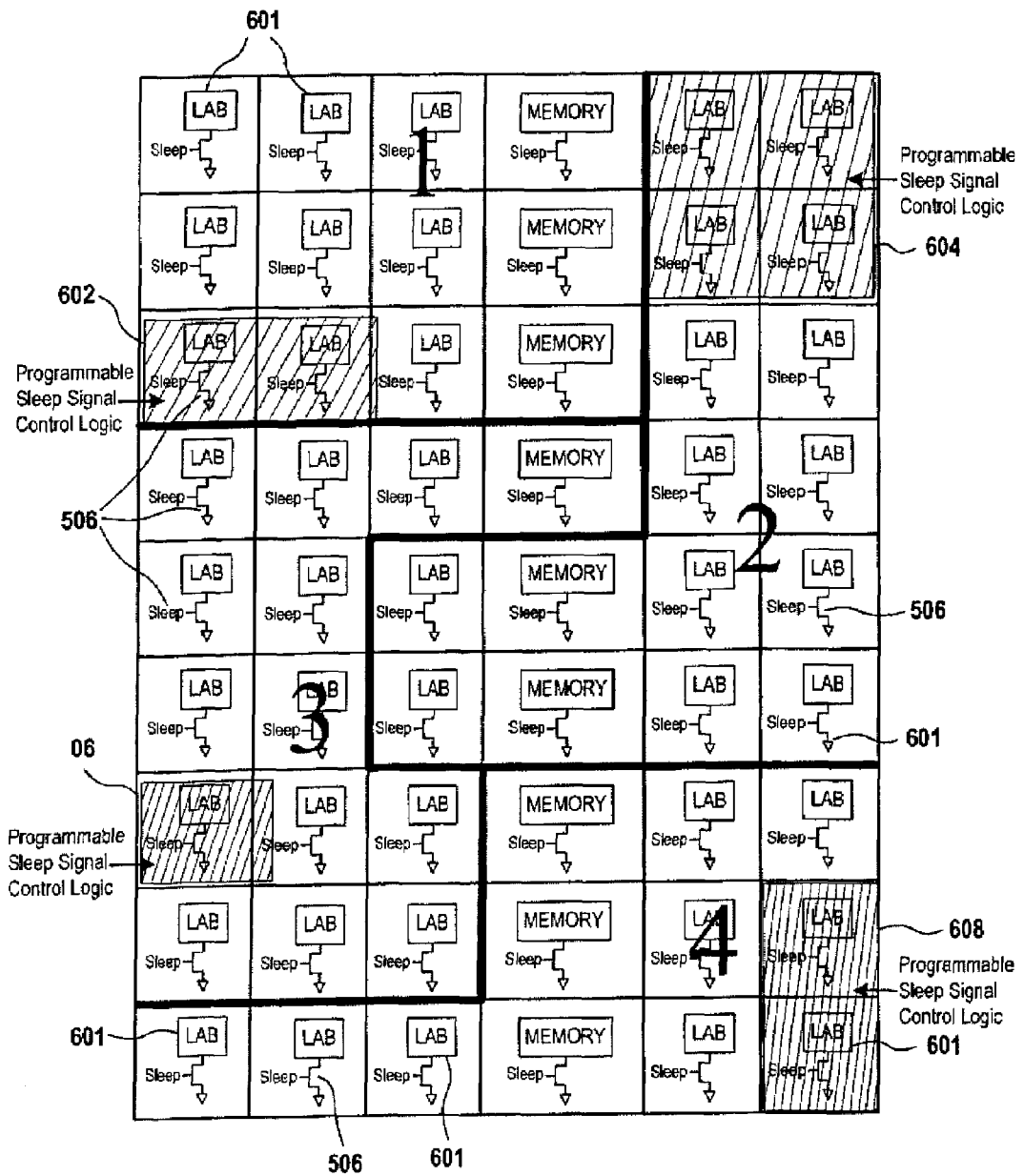
FIG. 5 illustrates the design layout of FIG. 4 having programmable sleep signal control logic defined within each region, in accordance with an embodiment of the present invention.

FIG. 5 illustrates the design layout of FIG. 4 having programmable sleep signal control logic defined within each region of the PLD. FIG. 5 is shown to include regions 1, 2, 3 and 4. Due to the programmable nature of the PLDs, it is undesirable to use hard-wired sleep signal control logic blocks in PLDs. As the regions 1,2, 3, and, 4 may be mapped in many different ways, having hard-wired sleep signal control logic blocks will restrict flexibility. Sleep signal control logic blocks 602, 604, 606, and 608 associated with regions 1, 2, 3, and 4, respectively, function to provide a programmable sleep signal to each sleep transistor 506. One skilled in the art should understand that the number of LABs 601 in each sleep signal control logic blocks 602, 604, 606, and 608 may vary. The sleep signal generated in the sleep signal control logic blocks 602, 604, 606, and 608 may then be routed to every sleep transistor 506 in their respective regions 1, 2, 3, and 4. In one embodiment, the sleep signal may be routed through general purpose routing wires (not shown) in the PLD. In another embodiment, the sleep signal may be routed via dedicated routing wires for sleep signals. The sleep signal may also be a dedicated global signal that is available to each region and utilized in combination with a configuration random access memory (CRAM) bit as described in more detail below with respect to FIG. 8. One skilled in the art should understand that it is not necessary that every region 1, 2, 3, and 4 include the sleep signal control logic blocks. In one embodiment one of the sleep signal control logic blocks 602, 604, 606 and 608 may be used to invoke sleep mode in one or more regions 1, 2, 3, and 4.

Figure 6:
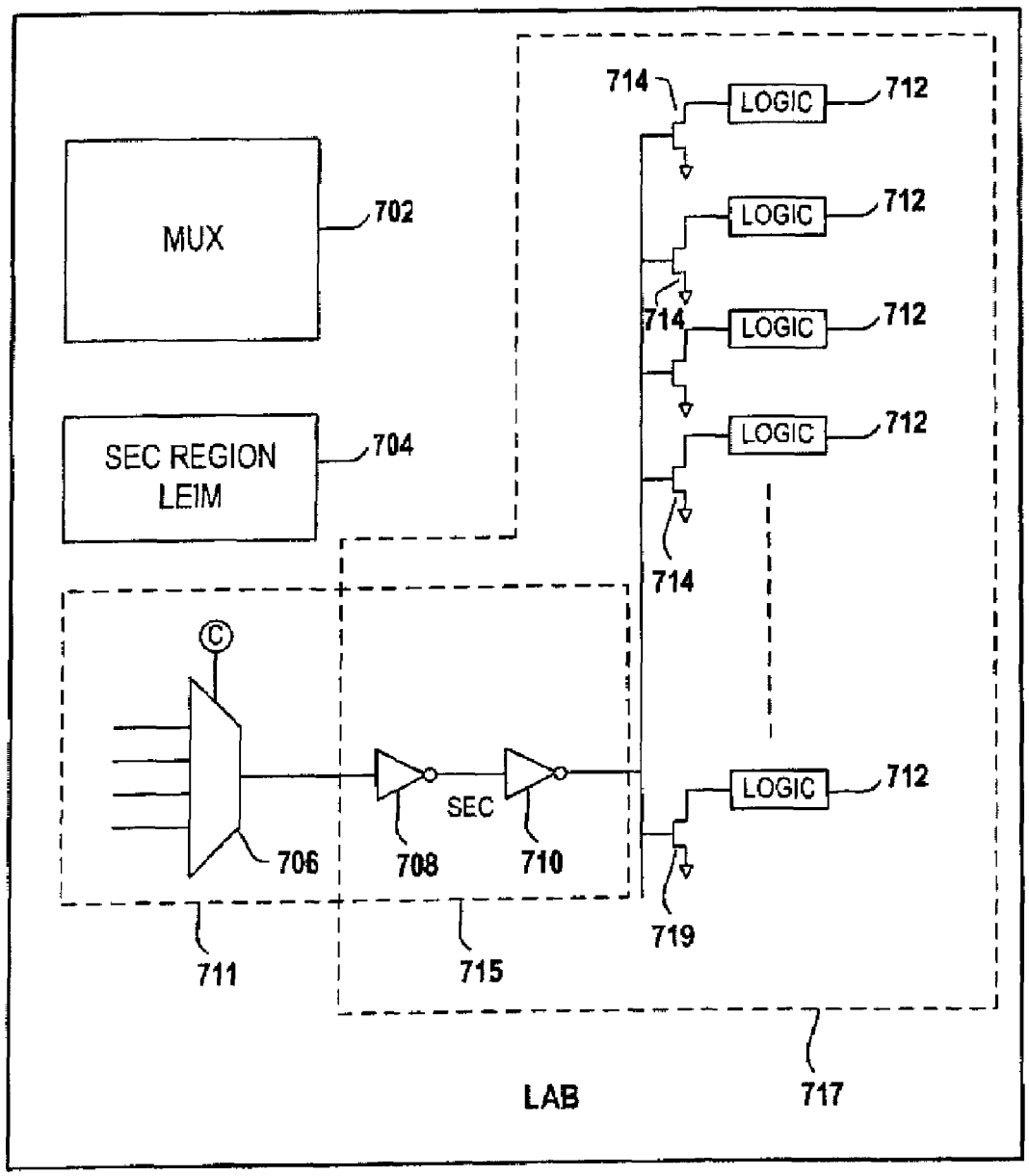
FIG. 6 illustrates the routing process of the sleep signal generated using sleep control logic, in accordance with an embodiment of the present invention.

FIG. 6 further illustrates the routing process within the LABs mentioned above with respect to FIG. 5, in accordance with an embodiment of the present invention. After the sleep signals are routed to each block (not shown) in the modules, the sleep signals are further routed to the sleep transistors within the LABs. Multiplexer (mux) 702 enables access to the LAB. The select signal for the mux 702 may be a configuration random access memory (CRAM) bit which is an output of a CRAM cell (not shown). FIG. 6 includes secondary mux 704. Secondary mux 704 functions to distribute signals to the logic units 712. FIG. 6 further includes a sleeper mux 706 within block 711 that is dedicated for selecting a sleep signal. The select signal for sleeper mux 706 may also be a CRAM bit. The output of sleeper mux is fed to buffers 708 and 710 of block 715. Buffers 708 and 710 are used to drive the output of the sleeper mux 706.

In one embodiment, buffers 708 and 710 are inverters included in core logic region 717. The output of buffer 710 is forwarded to the gate of sleep transistors 714. Each drain of sleep transistors 714 is connected to logic unit 712. Thus, when a LAB is to be put into sleep mode, the sleep signal is selected by mux 706 using the CRAM bit. The sleep signal is then forwarded to buffers 708 and 710. The buffers 708 and 710 drive the sleep signal to the gate of sleep transistors 714, which in turn will inactivate logic unit 712. One skilled in the art should understand that the size of the buffers can vary and the size depends on the number of sleep transistors 714, controlled by the buffers. In one embodiment, instead of turning of all the sleep transistors 714 at once, each individual sleep transistor 714 can be turned off. This will provide a finer granularity by selectively invoking sleep to individual logic unit 712. For example, the output of buffer 710 can be logically combined with an individual cram bit per logic section (712) to provide finer sleep control.

Figure 7:
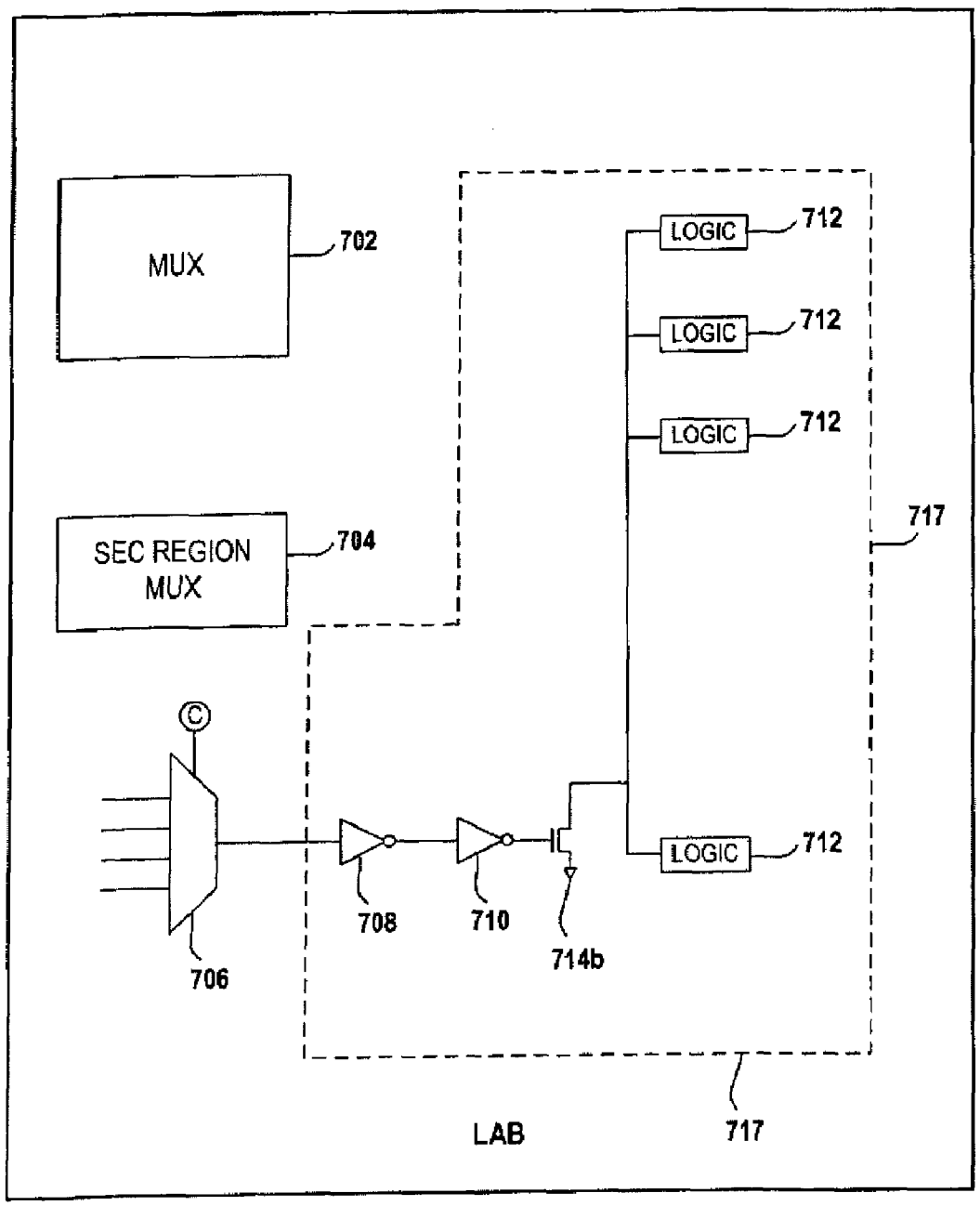
FIG. 7 shows an alternate way of invoking sleep using the sleep transistor, in accordance with an embodiment of the present invention.

FIG. 7 shows an alternative technique for invoking a sleep mode using the sleep transistor, in accordance with an embodiment of the present invention. FIG. 7 is similar to 6, except that all the logic units 712 within the LAB are placed in sleep mode using sleep transistor 714b. Instead of having an individual sleep transistor for each logic unit 712, this embodiment uses just a single sleep transistor 714b. The sleep signal from the mux 706 will switch off sleep transistor 714b.

Figure 8:
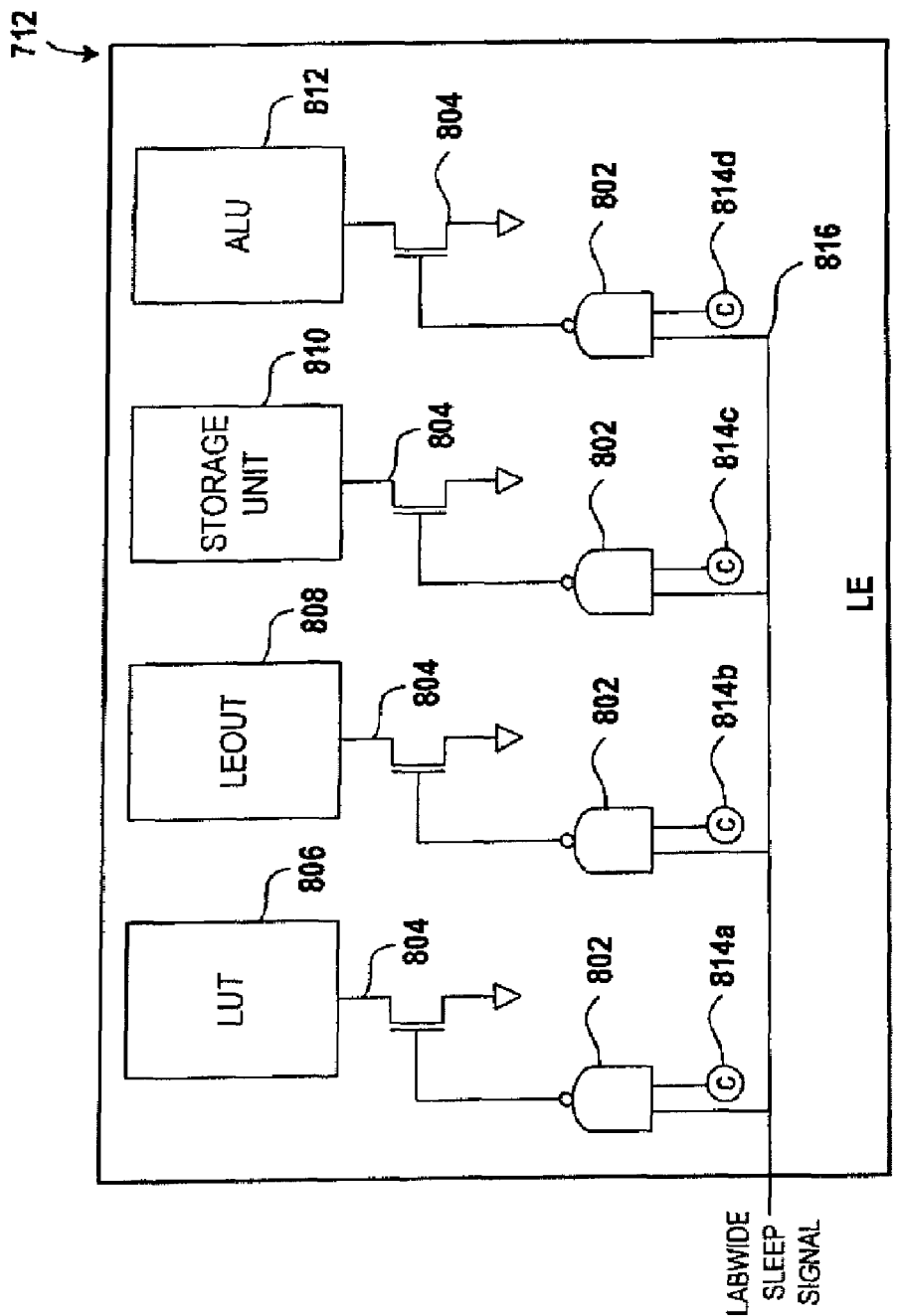
FIG. 8 illustrates logic unit, having separate sleep regions, in accordance with an embodiment of the present invention.

FIG. 8 illustrates a more detailed schematic of logic unit 712 of FIG. 7, having separate sleep regions, in accordance with an embodiment of the present invention. Logic unit 712, which may also referred to as a logic element, includes look up table (LUT) 806, logic out unit 808, storage unit 810, and arithmetic logic unit 812. Logic unit 712 is further shown to include NAND gates 802, CRAM cells 814a-d, and LAB wide sleep signal 816. In one embodiment, logic out unit 808 may include a set of buffers for driving the output of logic unit 712. In one embodiment, storage unit 810 is a register or a flip-flop. Arithmetic logic unit 812 may be used to perform arithmetic operations, such as addition, and subtraction. In one embodiment, the arithmetic logic unit 812 may be an adder.

In case of ICs, especially for PLDs, it is desirable to have part of the logic unit 712 shut off when inactive. For example, in case of a counter, the LUT 806 and storage 810 may be in use, while logic out unit 808 and arithmetic logic unit 812 are not in use. As such, logic out unit 808 and arithmetic logic unit 812 do not provide any utility and may leak current. Therefore, placing logic out unit 808 and arithmetic logic unit 812 into sleep mode can reduce leakage current. Here, part of the logic unit 712 is put into sleep mode by having LAB wide sleep signal 816 gated with the output of the CRAM cells 814a-d. Thus, the value of the labwide sleep signal 816, in combination with CRAM bits from the CRAM cells 814a-d, determine the output of the corresponding NAND gate. One skilled in the art should understand that shutting off logic out unit 808 and arithmetic logic unit 812 is exemplary, Depending on the design, other unused parts of the logic unit may be shut off.

In this example, when LAB wide sleep signal 816 is a logical high value and the output of the CRAM cells 814a-d is a logical high value then, the output of the NAND gate 802 will be a logical low value. The logical low value can switch off sleep transistors 804, which in turn may invoke a sleep mode in LUT 806, logic out unit 808, storage unit 810, or arithmetic logic unit 812. It should be appreciated that the logic high value may be a 1 and a logic low value may be a 0. One skilled in the art should understand that other types of gates besides NAND gate 802 might be connected to the gate of the sleep transistor 804, so long as the output of the gates can provide a logical low to the gate of the corresponding sleep transistor. In this manner, a portion of the logic elements within the logic block, a combination of the logic elements, or none of the logic elements are placed into a sleep mode.

Figure 9:
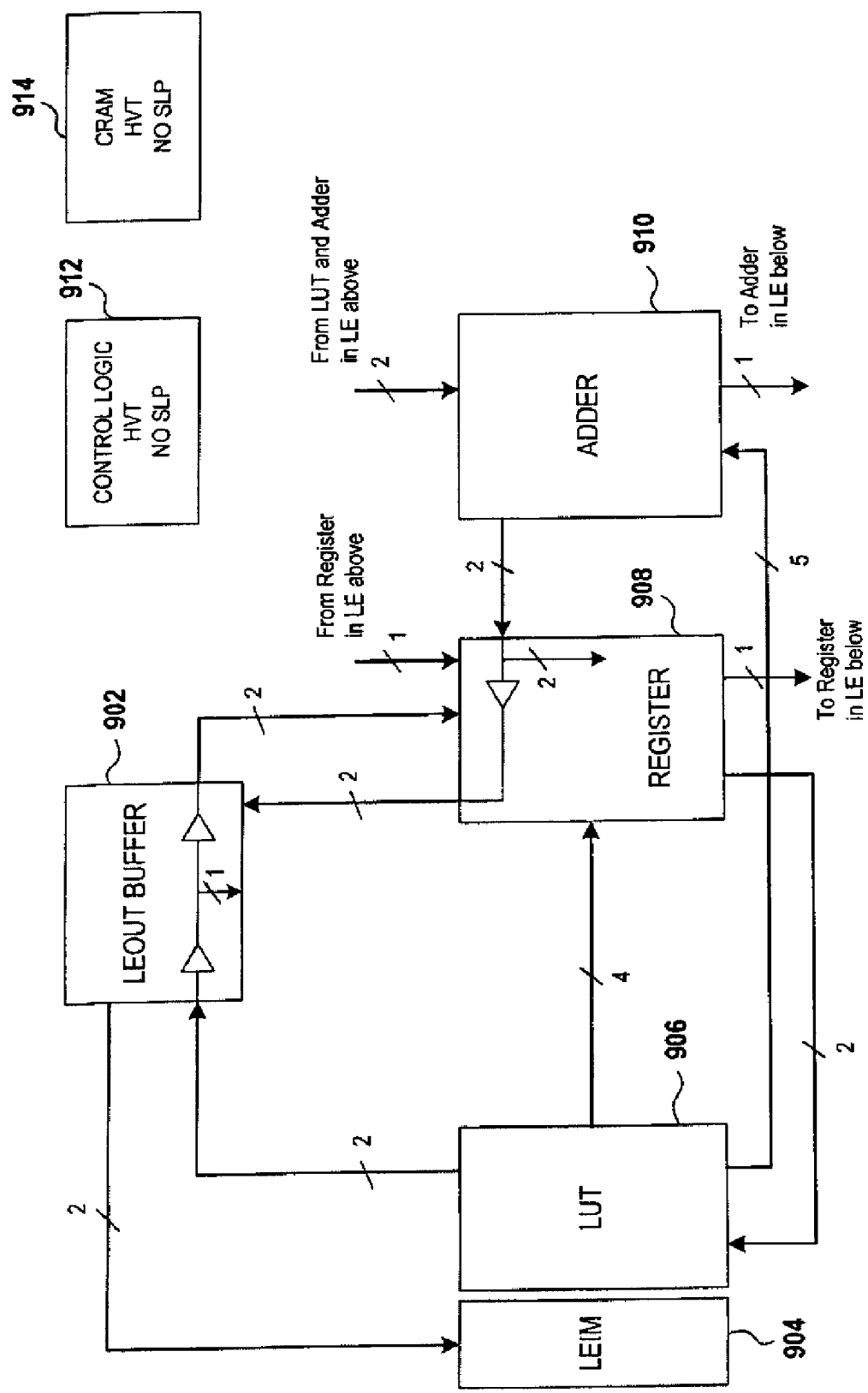
FIG. 9 illustrates the interactions between active and inactive regions within a logic unit, in accordance with an embodiment of the present invention.

FIG. 9 illustrates the interactions between active and inactive regions within a logic unit, in accordance with an embodiment of the present invention. The logic unit in FIG. 9 includes multiplexer 904, look up table (LUT) 906, logic out unit 902, register 908, adder 910, control logic unit 912, and CRAM 914. When a sleep transistor connected to a particular region is off, then that region is put into sleep mode and the internal nodes of that region become floating. Floating nodes confined to the interior of a sleep region generally are not an issue. However, circuits within the boundary of a sleep region may drive gates of regions that remain active. Floating inputs to these gates can create a direct current (dc) path, which can generate large static currents.

FIG. 9 further illustrates a number of signals from the sleep regions, interacting with other blocks that remain active. In this Figure, the LUT 906 receives a signal from register 908 and sends signals to logic out unit 902 and adder 910. Similarly, logic out unit, 902 sends signals to multiplexer 904 and register 908, and receives signals from register 908. It should be appreciated that register 908 receives and sends signals from other registers belonging to other logic units. For example, if LUT 906 is put into sleep mode, and logic out unit 902 remains active, then the signal going from LUT 906 to logic out unit 902 will float. One of the reasons for the floating signal may be due to the fact that the inverters (not shown) driving the signal are no longer powered. It will be apparent to one skilled in the art that a floating signal is in an indeterminate state. Thus, when a signal is going from a sleep region to another active region, floating signals must be prevented.

Control logic unit 912 is a general purpose control logic of the PLD. Generally, these general purpose control logic will not include sleep transistors because placing these control logic in a sleep mode might affect the functioning of the entire PLD. For example, when the PLD is being powered up, the state of all the CRAMs is unknown. Hence, a clear signal is sent throughout the PLD that clears all the CRAMs. However, the clear signal is sent throughout the PLD in stages to prevent large power surges. Therefore, general purpose control logic, such as control logic unit 912, is distributed throughout the PLD to control the transmission of signals such as the clear signals. In one embodiment, control logic unit 912 includes high threshold voltage (HVT) transistors, as the HVT helps to reduce leakage. Similarly, the CRAM 914 generally does not include sleep transistors because the CRAM has to be powered up for the CRAM to be functional. That is, in order to provide the CRAM bits with reference to the embodiment of FIG. 8 the CRAM bit must be powered.

Figure 10:
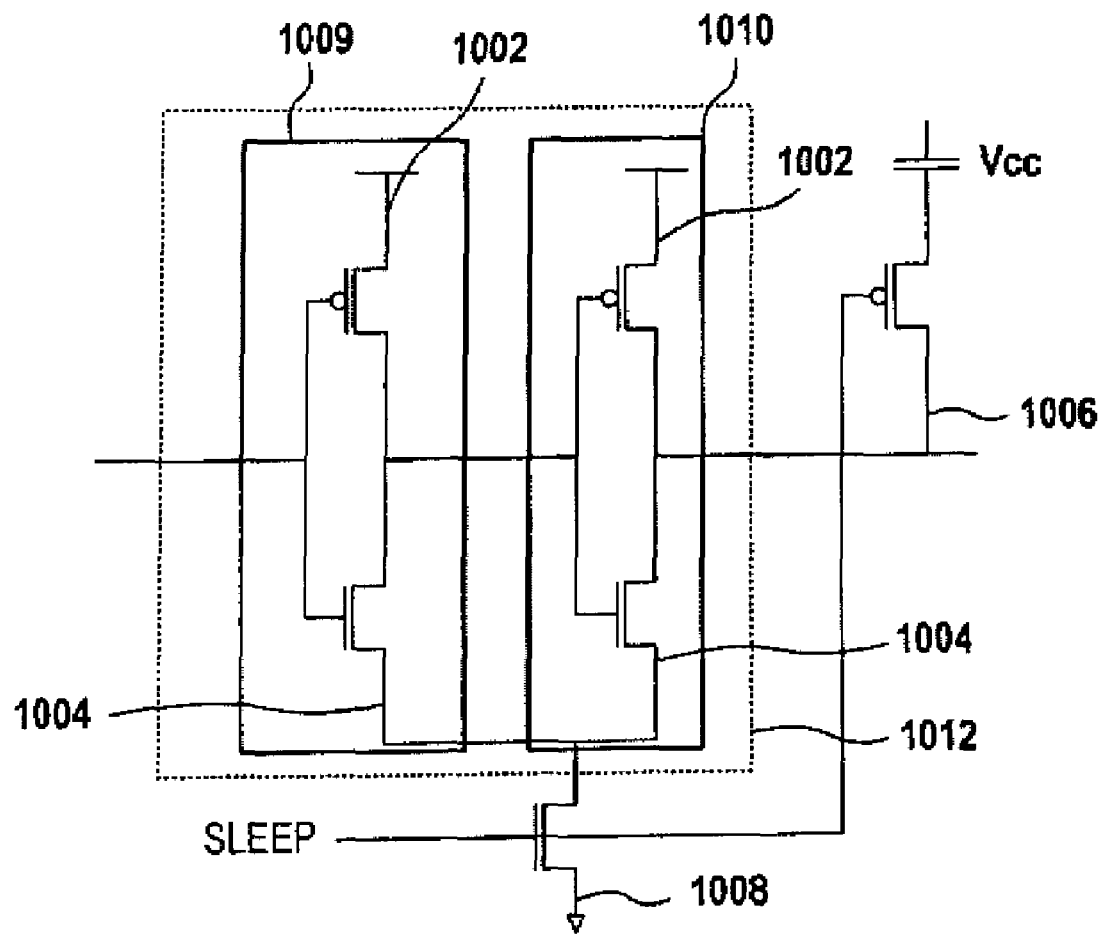
FIG. 10 illustrates an exemplary circuit for preventing floating of signals, in accordance with an embodiment of the present invention.

FIG. 10 illustrates an exemplary circuit for preventing floating nodes, in accordance with an embodiment of the present invention. FIG. 10 includes P-type metal oxide semiconductor (PMOS) transistors 1002, N-type metal oxide semiconductor transistors (NMOS) 1004, sleep transistor 1008, and pull up transistor 1006. Each PMOS transistor 1002 and NMOS transistor 1004 combination define inverters 1009 and 1010. The combination of inverters 1009 and 1010 can function as buffers for driving the signals, as described above. When a sleep signal turns the sleep transistor 1008 off, the inverters 1009 and 1010 will enter sleep mode. Therefore, the output of the inverter 1010 will be floating. However, in this example, floating is prevented using pull up transistor 1006. Pull up transistor 1006 is a PMOS transistor, and the PMOS transistor conducts when the input at the gate is a low. The gate of the pull up transistor 1006 is tied to sleep signal 1008. Consequently, when the sleep signal puts the inverters 1009 and 1010 into sleep mode, by switching off the sleep transistor 1008, the output of the inverter 1010 is pulled up high by the pull up transistor 1006. In this example, pull up transistor 1006 pulls the voltage up to $V_{cc}$. Thus, the signal going out to another region from the sleep region will not be at an indeterminate state.

Figure 11A:
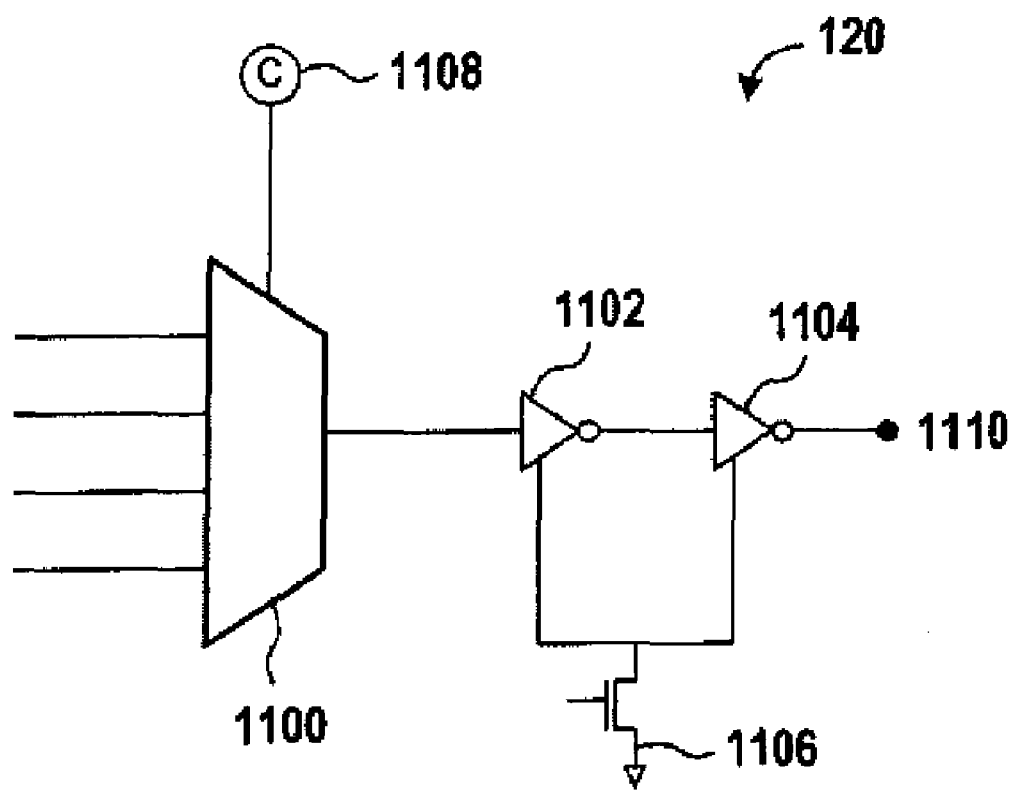
FIG. 11A shows a high level schematic diagram of a routing driver, in accordance with an embodiment of the present invention.

FIG. 11A shows a high level schematic diagram of a routing driver 120 shown in FIG. 1. The routing driver 120 includes a multiplexer 1100, inverters 1102 and 1104, and sleep transistor 1106. Multiplexer 1100 is associated with a select signal, which is a CRAM bit 1108. A sleep signal applied to the gate of the sleep transistor 1106 will put the inverters 1102 and 1104 to sleep. Therefore, any signal that is being driven by the inverters 1102 and 1104 will be floating at node 1110. If the routing driver 120 is located in a LAB 100, as shown in FIG. 1, then when the routing driver 120 is put into sleep mode, the signal output from that LAB to other LABs will be floating. Therefore, there is a need to bring the signal to determinate state.

Figure 11B:
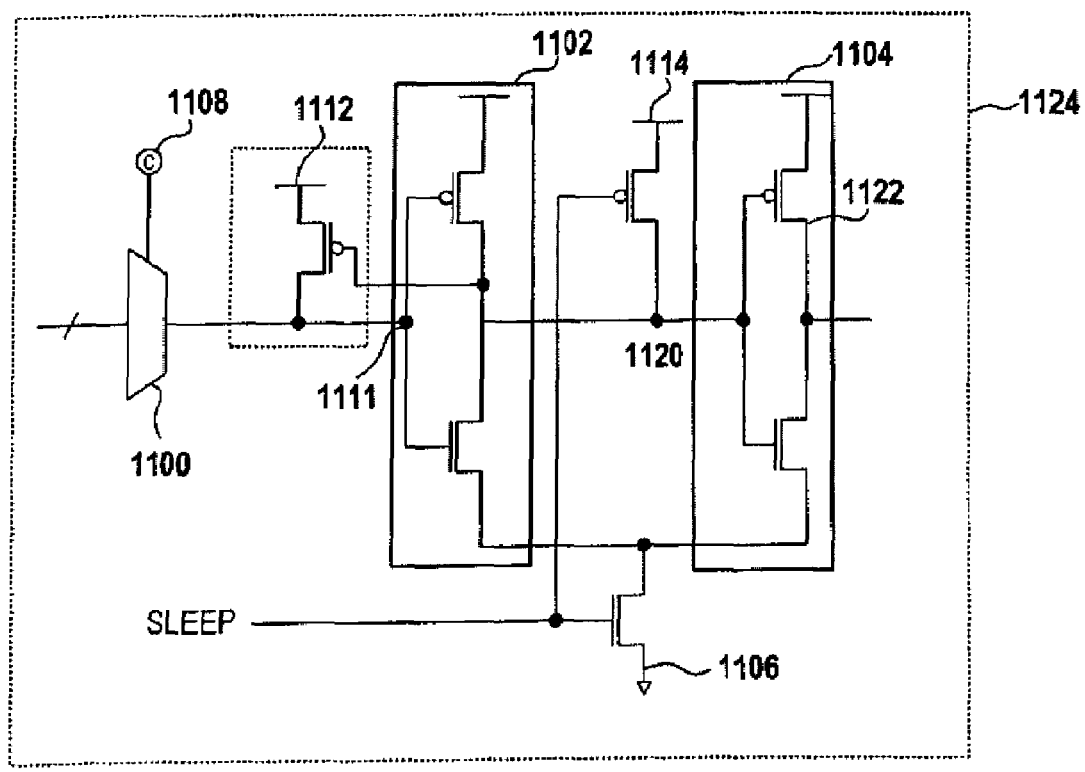
FIG. 11B illustrates an exemplary circuit for bringing signals, from the routing driver that is put into sleep mode, to a determinate state, in accordance with an embodiment of the present invention.

FIG. 11B illustrates an exemplary circuit for bringing signals from the routing driver that is put into sleep mode, to a determinate state, in accordance with an embodiment of the present invention. FIG. 11B is similar to 11A except that two additional transistors 1112 and 1114 are added to maintain a determinate state at nodes 1118, 1120, and 1110, respectively. In one embodiment, the multiplexer 1100 includes NMOS pass gate transistors (not shown). The NMOS pass gate transistors generally do not allow the full voltage, i.e. power supply ($V_{cc}$), to reach the input of the inverter 1102. The actual voltage that will reach the input of the inverter 1102 is in the range of $V_{cc}$—threshold voltage ($V_t$) of the transistor. In order to correct this deficiency, a half latch 1112 is added to the circuit. In one embodiment, the half latch 1112 is a PMOS transistor. When the inverter 1102 is put into sleep mode using sleep transistor 1106, the low voltage will turn on the half latch 1112, which in turn causes the node 1118 to be pulled up to $V_{cc}$. Similarly, when the sleep signal is applied to the sleep transistor, 1106, the low voltage will turn on pull up transistor 1114. The pull up transistor 1114 will pull the voltage up to $V_{cc}$ at node 1120. Without the pull up transistor 1114, the node 1120 would be floating when sleep transistor 1106 is off and the PMOS transistor 1122 of the inverter would be partially conducting, which results in the current leaking through PMOS transistor 1122 to ground. Therefore, switching off PMOS 1122 using the pull up transistor 1144 reduces this leakage.

Figure 11C:
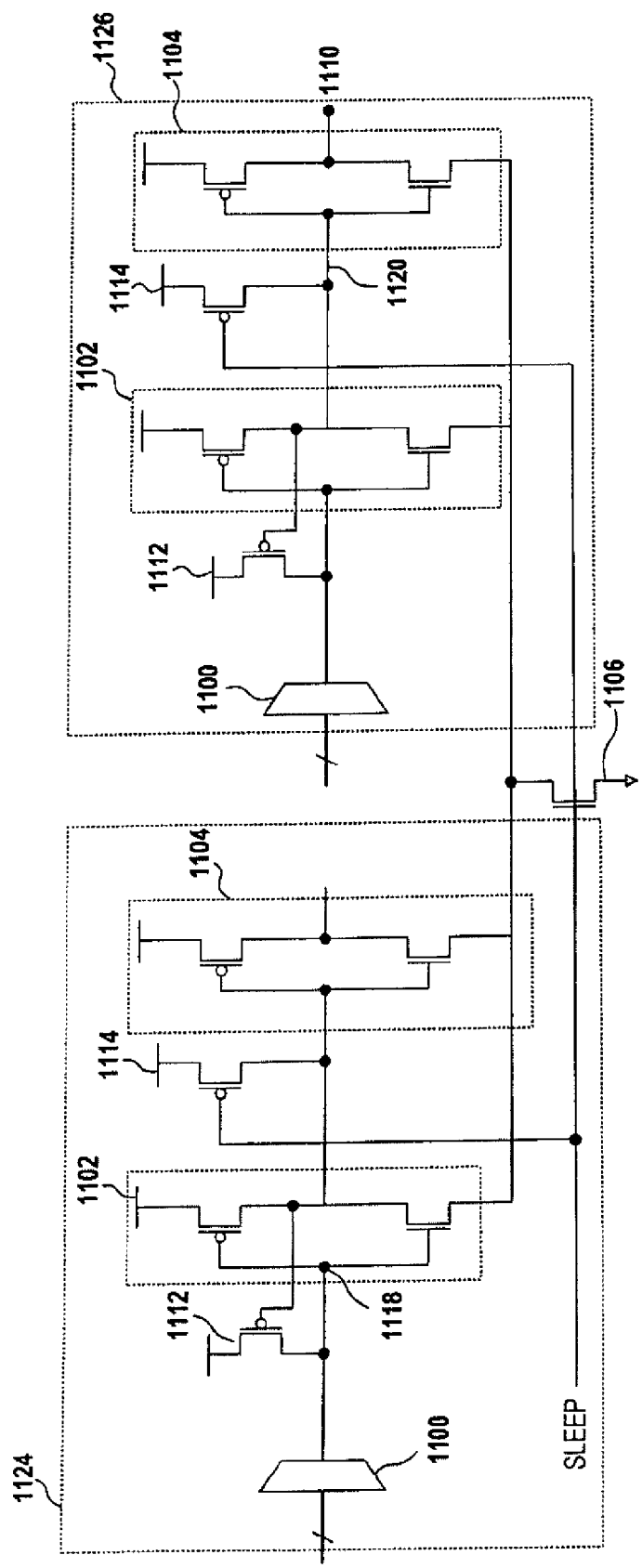
FIG. 11C illustrates a sleep transistor being shared among two routing drivers, in accordance with an embodiment of the present invention.

FIG. 11C further illustrates that the sleep transistor 1106 of FIG. 11B can be shared among two routing drivers, in accordance with an embodiment of the present invention. As shown, two routing drivers 1124 and 1126 share sleep transistor 1106. Sharing the sleep transistor among multiple routing drivers results in fewer number of sleep transistors. It should be appreciated that fewer number of sleep transistors can not only save area required for the sleep transistors, but also the area required for the number CRAM cells to control the sleep transistors.

Figure 12:
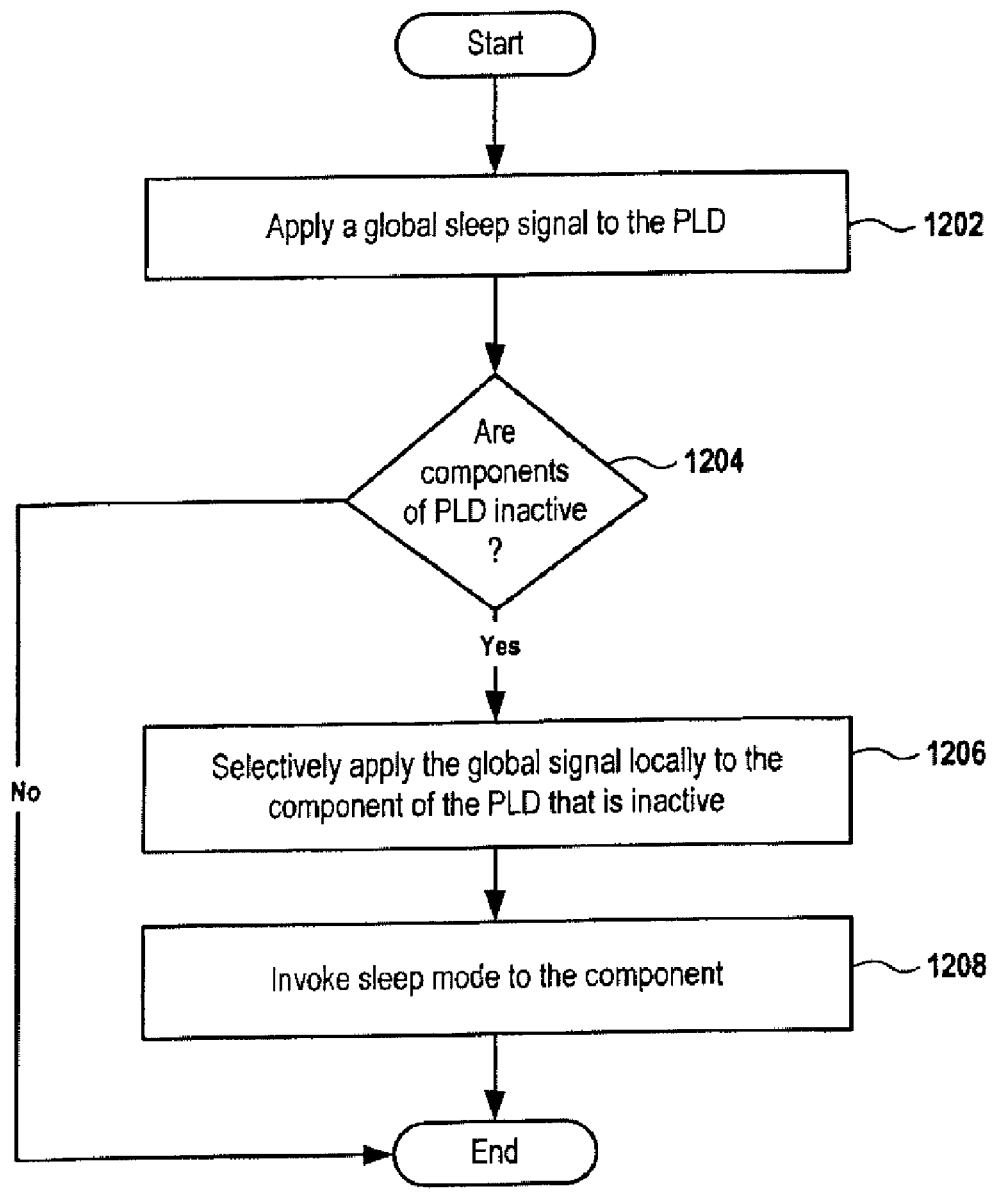
FIG. 12 is a flow chart illustrating the method of operations involved in applying a sleep mode to components of a PLD, in accordance with an embodiment of the present invention.

FIG. 12 is a flow chart illustrating the method of operations involved in applying sleep mode to components of a PLD, in accordance with an embodiment of the present invention. The method begins with operation 1202, where a global sleep signal is applied to the entire PLD. The global sleep signal can be channeled to the individual components, within the PLD. The method then moves to operation 1204 where it is determined whether a component of the PLD is inactive. Inactivity may be determined using a variety of methods for example, monitoring the input and output pins of the component. If inactivity is determined in a component then, that component may be entered into a sleep mode so that the inactive component will not leak current. The global sleep signal is selectively directed to the component within the PLD that is inactive as shown in operation 1206. As described above, the components within the PLD are connected to sleep transistors and the sleep signal will switch off the sleep transistors resulting in a sleep mode being invoked in the component connected to the sleep transistor, as specified in operation 1208. Further, if the component is determined to be active, then the global sleep signal is prevented from inactivating an active component as shown in operation 1210. As described above with respect to FIG. 8, the global sleep signal is gated with the output of a CRAM cell and the output of the CRAM cell determines whether the global sleep signal should be transmitted to any component within the PLD.

The method and system, described herein may be used with any suitable integrated circuit (IC). The IC for example, may be programmable logic devices such as field programmable gate array (FPGA), programmable array logic (PAL), programmable logic array (PLA), field programmable logic array (FPLA), electrically programmable logic devices (EPLD), electrically erasable programmable logic device (EEPLD), logic cell array (LCA), just to name a few. The programmable logic device may be a part of a data processing system that includes one or more of the following components: a processor, memory, I/O circuitry, and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operations, unless explicitly stated in the claims.

What is claimed is:

1. An integrated circuit (IC) having minimal leakage current for inactive logic blocks, comprising:
   a plurality of programmable logic blocks, one of the plurality of programmable logic blocks monitoring a level of activity of each remaining programmable logic block;
   a plurality of driven wires defining a routing pattern between the plurality of programmable logic blocks, the one of the plurality of programmable logic blocks transmitting a signal invoking a global sleep mode for the plurality of programmable logic blocks; and
   combinatorial logic within each of the plurality of programmable logic blocks, the combinatorial logic configured to shut down a portion of a corresponding programmable logic block through a sleep circuit associated with the portion of the programmable logic block.

2. The IC of claim 1, further comprising:
   a routing driver for driving an output from the portion of the programmable logic block, the routing driver including a pull-up transistor for bringing the output to a determinate state when the portion of the programmable logic block enters a sleep mode, a gate of the pull up transistor receiving the signal.

3. The IC of claim 2 wherein the pull-up transistor is a half latch.

4. The IC of claim 2, wherein the pull-up transistor is a PMOS transistor.

5. The IC of claim 2, wherein the pull up transistor is an NMOS transistor.

6. The IC of claim 1, wherein the one of the plurality of programmable logic blocks is configured to monitor input pins and output pins associated with each remaining programmable logic block in order to determine whether corresponding logic blocks are associated with one of an inactive mode or an active mode.

7. The IC of claim 1, wherein the combinatorial logic gates the signal with a configuration random access memory bit.

8. An integrated circuit (IC) having programmable sleep states, comprising:
   a plurality of programmable logic blocks, one of the plurality of programmable logic blocks transmitting a sleep signal to each remaining programmable logic block, each remaining programmable logic block including a plurality of logic elements;
   a plurality of driven wires defining a routing pattern between the programmable logic blocks, the one of the plurality of programmable logic blocks transmitting the sleep signal through the routing pattern; and
   logic gating the sleep signal with a bit within each of the plurality of logic elements;
   a transistor associated with each corresponding component within each logic element, a gate of the transistor receiving output from the logic gating the sleep signal, wherein a portion of the components of the logic elements within the programmable logic block are put into sleep mode by activating the transistor while a remaining portion of the components of the logic elements are active.

9. The IC of claim 8, wherein each of the plurality of programmable logic blocks-further comprises:
   a first multiplexer enabling access to corresponding programmable logic block; and
   a second multiplexer distributing signals to the plurality of logic elements within the corresponding programmable logic block.

10. The IC of claim 9, wherein the logic gating the signal is a NAND gate.

11. The IC of claim 8, wherein the transistor is an NMOS transistor.

12. The IC of claim 8, wherein the components of each of the plurality of logic elements includes a look up table, an arithmetic logic unit, a storage element, and a logic out unit, and wherein within each logic element.

13. The IC of claim 12, wherein one of the plurality of logic elements is configured with the arithmetic logic unit and the logic out unit are put into sleep mode and the look up table and the storage element are active a subset of the plurality of logic elements within a logic block receives the sleep signal thereby inactivating the subset of logic elements, while remaining logic elements within the logic block are active.

14. A method reducing leakage current in an integrated circuit (IC) comprising method operations of:
   applying a global sleep signal to the integrated circuit;
   determining whether a component within a logic block of the IC is in an inactive mode;
   if the component is determined to be in the inactive mode, the method includes,
   applying the global sleep signal to the component of the logic block of the IC that is inactive to minimize leakage current associated with the component; and
   for remaining active components of the logic block the method includes,
   preventing the global sleep signal from inactivating the component so that a portion of the logic block is active while the component is inactive.

15. The method of claim 14, wherein the method operation of determining whether a component is inactive includes,
   monitoring one of an input pin or an output pin of the component.

16. The method of claim 14, further comprising:
   determining whether an output of the component that is in the inactive mode is an input into an active component;
   if the output of the component that is in the inactive mode is an input into the active component, then the method includes,
   forcing the output to a determinate state.

17. The method of claim 16, wherein the method operation of forcing the output to a determinate state includes,
   applying the global sleep signal to a gate of a pull-up transistor associated with a node at the output of the component;
   forcing an output voltage of the component to a source voltage through the pull-up transistor.

18. The method of claim 16, wherein the method operation of forcing the output to a determinate state includes,
   applying the global sleep signal to a gate of a pull-down transistor associated with a node at the output of the component;
   forcing an output voltage of the component to ground through the pull-down transistor.

19. The method of claim 14, wherein the method operation of preventing the global sleep signal from inactivating the component includes,
   gating the global sleep signal with a bit within the component within the logic block.

20. The method of claim 14, wherein the method operation of applying the global sleep signal to the component of the logic block of the IC that is inactive to minimize leakage current associated with the component includes,
   selectively applying the global sleep signal to a portion of logical elements within a logic block of the IC.

\* \* \* \* \*